(12) United States Patent
Chen et al.

(10) Patent No.: US 11,527,272 B2
(45) Date of Patent: Dec. 13, 2022

(54) PSEUDO-ANALOG MEMORY COMPUTING CIRCUIT

(71) Applicant: XX MEMORY TECHNOLOGY CORP., Zhuhai (CN)

(72) Inventors: Li Che Chen, Hsinchu (TW); Cheng Jye Liu, Zhubei (TW); Heng Cheng Yeh, Zhubei (TW)

(73) Assignee: XX Memory Technology Corp., Zhuhai (CN)

( * ) Notice: Subject to any disclaimer, the term of this patent is extended or adjusted under 35 U.S.C. 154(b) by 0 days.

(21) Appl. No.: 17/355,595

(22) Filed: Jun. 23, 2021

(65) Prior Publication Data

US 2021/0407560 A1     Dec. 30, 2021

(30) Foreign Application Priority Data

Jun. 29, 2020  (TW) ................................ 109121847

(51) Int. Cl.
| | | |
|---|---|---|
| *G11C 7/10* | (2006.01) | |
| *G11C 13/00* | (2006.01) | |
| *G11C 5/06* | (2006.01) | |

(52) U.S. Cl.
CPC ................ *G11C 7/109* (2013.01); *G11C 5/06* (2013.01); *G11C 7/10* (2013.01); *G11C 7/1063* (2013.01); *G11C 7/1069* (2013.01); *G11C 7/1096* (2013.01); *G11C 13/004* (2013.01)

(58) Field of Classification Search
CPC ......... G11C 7/10; G11C 7/109; G11C 7/1063; G11C 7/1069; G11C 7/1096; G11C 5/06; G11C 13/004
USPC .................................................. 365/189.011
See application file for complete search history.

(56) References Cited

U.S. PATENT DOCUMENTS

| | | | |
|---|---|---|---|
| 8,773,167 | B2 | 7/2014 | Robinett et al. |
| 9,563,213 | B2 | 2/2017 | Addepalli et al. |
| 10,242,737 | B1 * | 3/2019 | Lin .......... H01L 45/16 |
| 10,783,963 | B1 * | 9/2020 | Hung ................ G11C 13/004 |

FOREIGN PATENT DOCUMENTS

| | | |
|---|---|---|
| TW | 201824755 A | 7/2018 |
| TW | 202013213 A | 4/2020 |
| WO | 2019/051354 A1 | 3/2019 |

\* cited by examiner

*Primary Examiner* — Son L Mai
(74) *Attorney, Agent, or Firm* — Rosenberg, Klein & Lee

(57) ABSTRACT

A pseudo-analog memory computing circuit includes at least one input circuit, at least one output circuit and at least one pseudo-analog memory computing unit. Each pseudo-analog memory computing unit is coupled between one of the at least one input circuit and one of the at least one output circuit and has at least one weight mode. Each pseudo-analog memory computing unit generates at least first computing result for a coupled output circuit according to a weight of a selected weight mode and at least one input signals of a coupled input circuit.

9 Claims, 14 Drawing Sheets

PSEUDO-ANALOG MEMORY COMPUTING CIRCUIT

This application claims priority of Application Ser. No. 109121847 filed in Taiwan on 29 Jun. 2020 under 35 U.S.C. § 119; the entire contents of all of which are hereby incorporated by reference.

BACKGROUND OF THE INVENTION

Field of the Invention

The present invention relates to a pseudo-analog memory computing circuit.

Description of the Related Art

Refer to FIG. 1. In a conventional computer architecture 10, the processor 16 obtains data from the memory 12 via the bus 14 and then performs computation. However, the speed of the processor 16 is growing faster and faster, and the transmission speed of the bus 14 becomes unable to follow the speed of the processor 15. Thus, while the processor 16 has completed the computation of a piece of data, the bus 14 may be unable to complete the transmission of the next piece of data in time. Then, the processor 16 have to wait for a period of time before it can compute the next piece of data. In other words, the computation ability of the computer architecture 10 is limited by the transmission speed of the bus 14. As the AI circuit needs to perform a lot of multiply-accumulate operation (MAC), the conventional computer architecture 10 is no more suitable to be used in the AI circuit.

Refer to FIG. 2. A computing circuit 20, which is built in a memory, is proposed to increase the computation ability of the computer architecture 10. As the computing circuit 20 is arranged inside the memory 12, it is unnecessary to transmit data to the processor 16 via the bus 14. Thus, the computation ability is no more limited by the transmission speed of the bus 14. In the computing circuit 20, digital-to-analog converters 21, 22 and 23 respectively convert data X1, X2 and X3 into voltages (the input signals) V1, V2 and V3. Resistors RA1-RC3 are the weights necessary for computation of the AI circuit. According to voltages V1, V2 and V3, the resistors RA1-RA3 respectively generate currents (the computation results). The generated currents accumulate to generate a current IA to an analog-to-digital converter 24, and the analog-to-digital converter 24 generates an output data Y1. Similarly, the currents generated by RB1-RB3 accumulate to generate a current IB to an analog-to-digital converter 25, and the analog-to-digital converter 25 generates an output data Y2. The currents generated by RC1-RC3 accumulate to generate a current IC to an analog-to-digital converter 26, and the analog-to-digital converter 26 generates an output data Y3. Then, the memory 12 transmits the output data Y1, Y2 and Y3 to the processor 16 via the bus 14.

The AI circuit often performs multi-layer computation, and different layers of computation respectively need different weights. Therefore, a plurality of computing circuits 20 and 20' is required. Refer to FIG. 3. The computing circuits 20 and 20' are identical in the architectures but different in the resistances (weights) of the resistors. In the example of identifying sounds, the first computing circuit 20 uses a first group of weights to compute the input data X1, X2 and X3 to generate the output data Y1, Y2 and Y3. The processor 16 determines the volumes of sounds according to the output data Y1, Y2 and Y3. The second computing circuit 20' uses a second group of weights to compute the output data Y1, Y2 and Y3 of first computing circuit to generate the output data Y1', Y2' and Y3'. The processor 16 determines the frequencies or keywords of sounds according to the output data Y1', Y2' and Y3'. The more the layers of computation, the more the computing circuits required, and the larger the area occupied.

The conventional computing circuit 20 uses a NOR flash memory to store the data of weights. However, the multi-level cells are hard to realize in a NOR flash. Thus, the number of the bits of a memory unit, which can be used in computation, is limited. Besides, the technology scaling trend and operation speed have reached the bottleneck in the NOR flash memory.

SUMMARY OF THE INVENTION

One objective of the present invention is to provide a pseudo-analog memory computing circuit.

According to one embodiment, the pseudo-analog memory computing circuit of the present invention comprises at least one input circuit, at least one output circuit, and at least one pseudo-analog memory computing unit. Each pseudo-analog memory computing unit includes at least one input terminal coupled to one of the at least one input circuit; and at least one output terminal coupled to one of the at least one output circuit. Each pseudo-analog memory computing unit further includes at least one weight mode. Each pseudo-analog memory computing unit generates at least one first computation result at the at least one output terminal and sends the at least one first computation result to the coupled output circuit according to a weight of the selected weight mode and at least one input signal from the coupled input circuit.

The pseudo-analog memory computing circuit of the present invention has a better computation ability and can vary the weight according to different weight modes. Therefore, the present invention can use a single pseudo-analog memory computing circuit to perform multi-layer computation and thus decrease the area of a memory.

DETAIL DESCRIPTION OF THE PRESENT INVENTION

Figure 1:
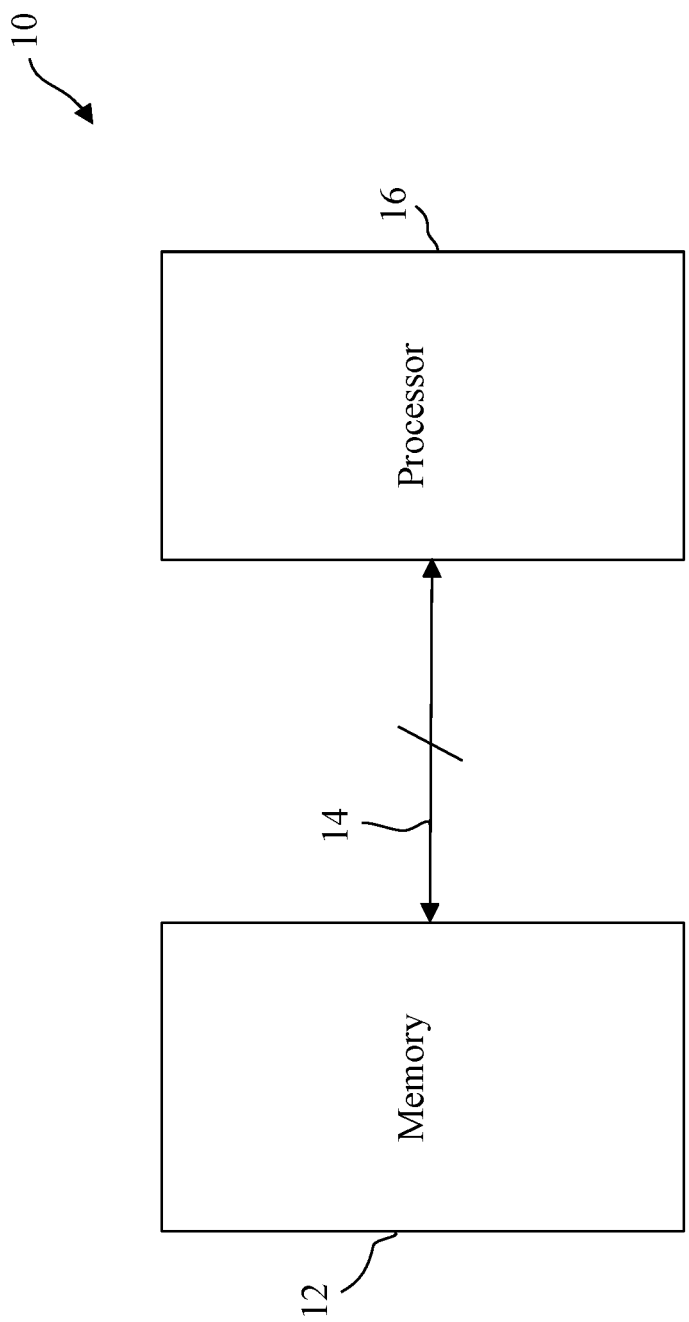
FIG. 1 schematically shows a conventional computer architecture.
Figure 2:
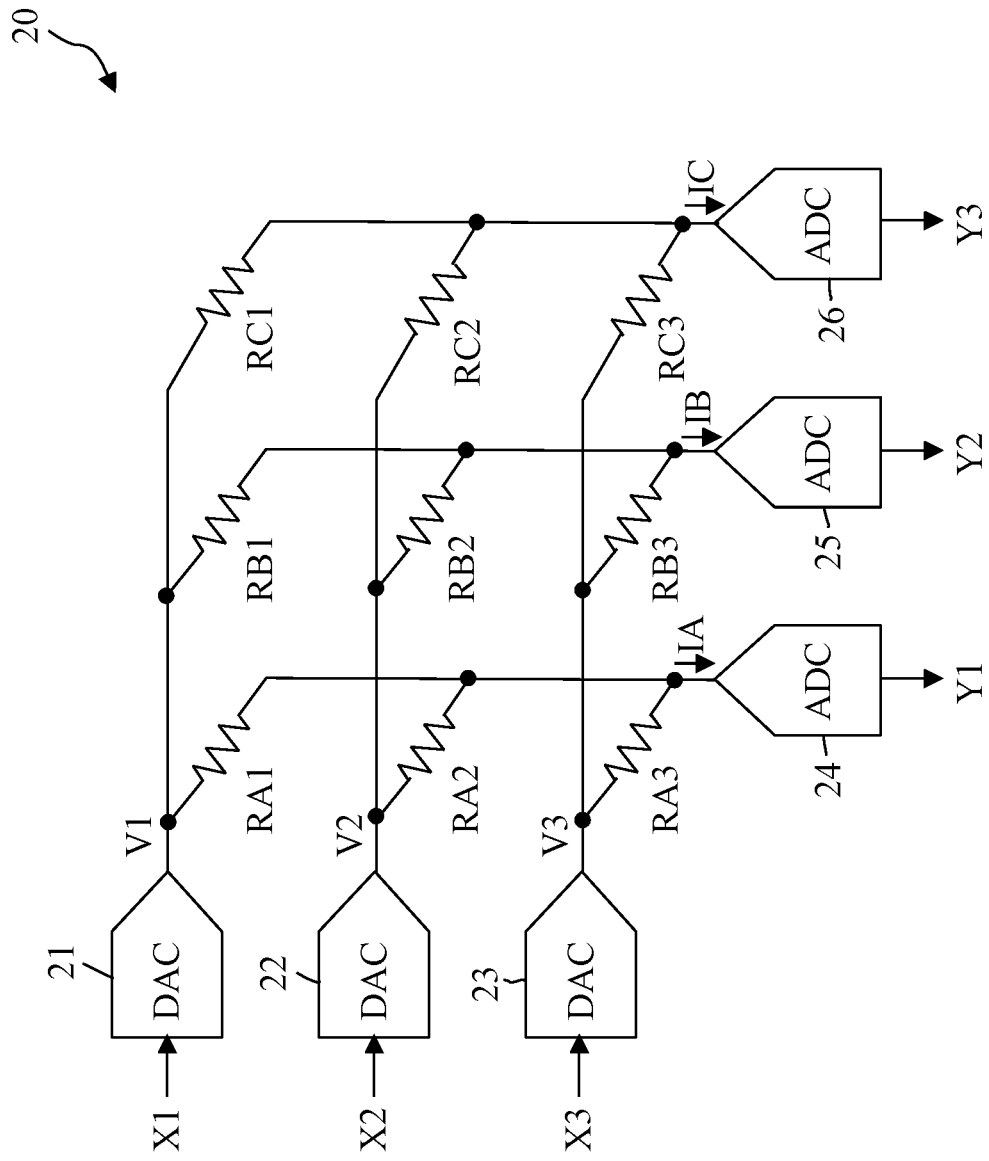
FIG. 2 schematically shows a conventional computing circuit.
Figure 3:
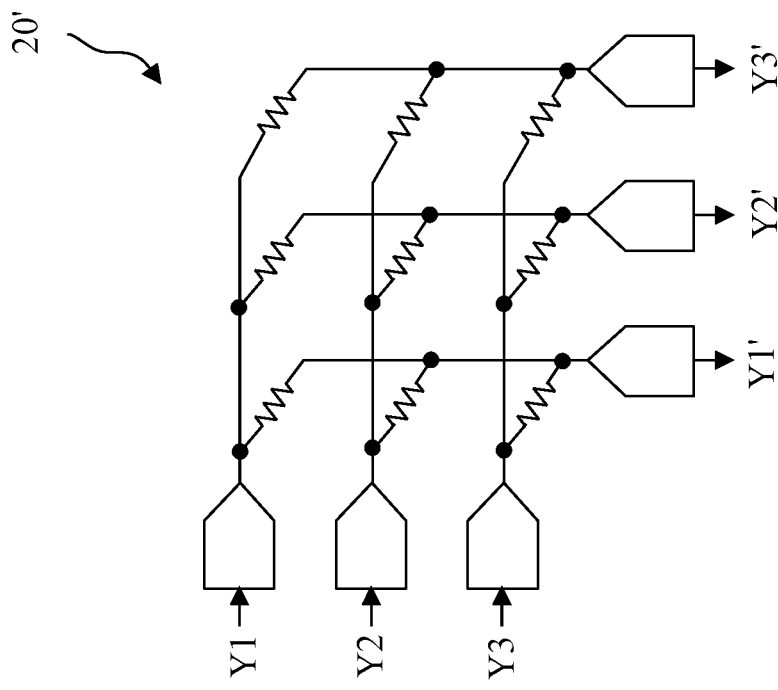
FIG. 3 schematically shows a conventional multi-layer computation architecture.
Figure 3:
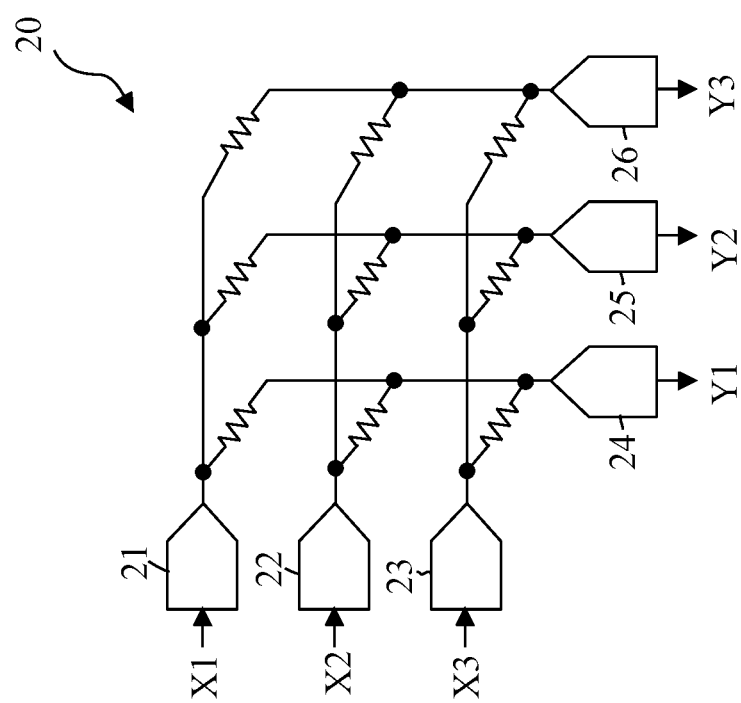
Figure 4:
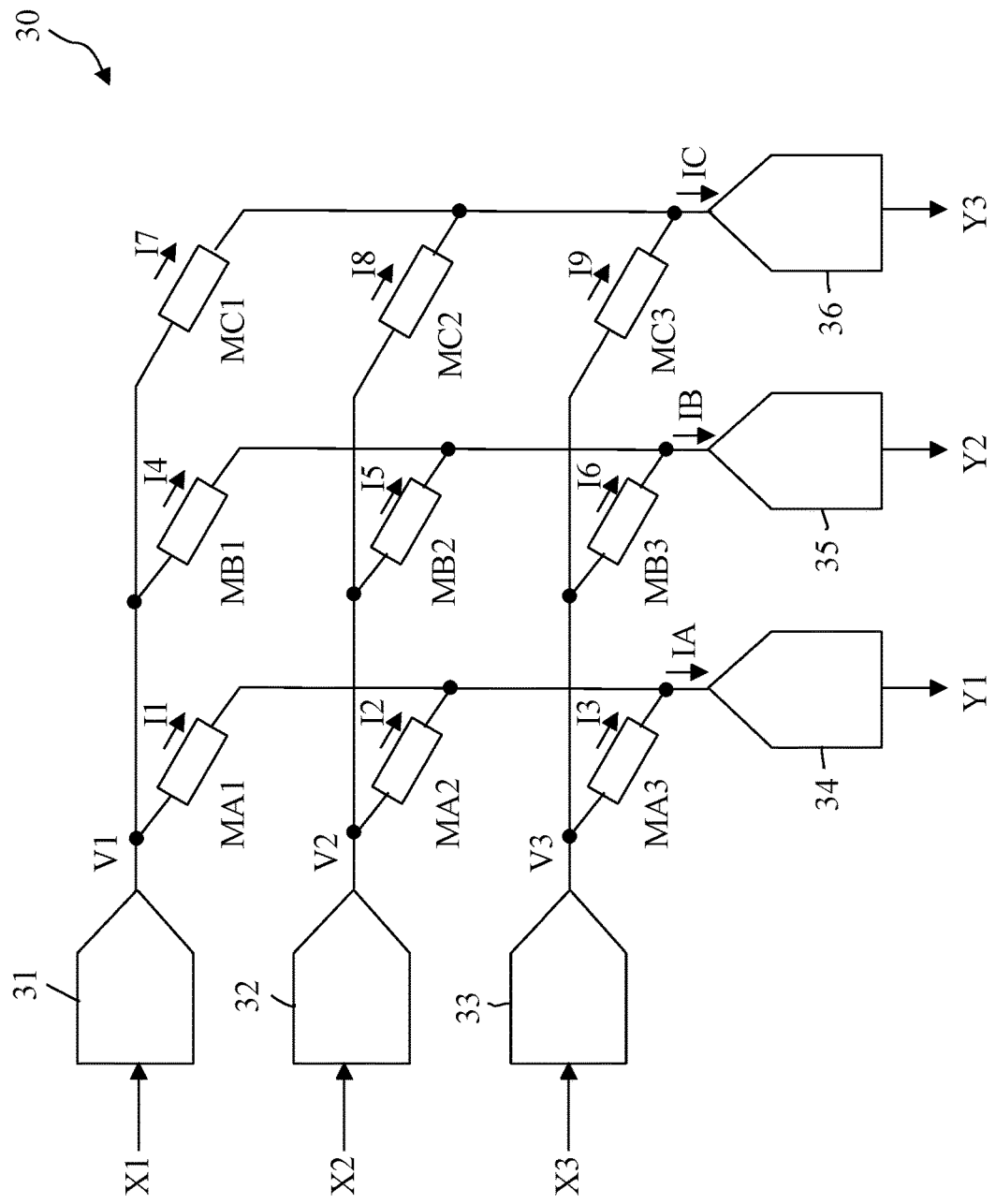
FIG. 4 schematically shows a first embodiment of the pseudo-analog memory computing circuit of the present invention.

FIG. 4 schematically shows a first embodiment of the pseudo-analog memory computing circuit of the present invention. In FIG. 4, the pseudo-analog memory computing circuit 30 of the present invention comprises a plurality of input circuits 31, 32 and 33; a plurality of output circuits 34, 35 and 36; and a plurality of pseudo-analog memory computing units MA1-MC3. The numbers of the input circuits, the output circuits and the pseudo-analog memory computing units are not limited by the numbers shown in FIG. 4 but may be varied according to practical requirement. For example, the pseudo-analog memory computing circuit may have only one input circuit, one output circuit and one pseudo-analog computing unit. In one embodiment, the plurality of input circuits 31, 32 and 33 can be the digital-to-analog converters 21, 22, and 23 in FIG. 2, and the plurality of output circuits 34, 35 and 36 can be the analog-to-digital converters. In one embodiment, the input circuits 31, 32 and 33 can be metal wires. In such a case, the input data X1, X2 and X3 are respectively equal to the input signals V1, V2 and V3, and the input data X1, X2 and X3 are analog data.

Figure 5:
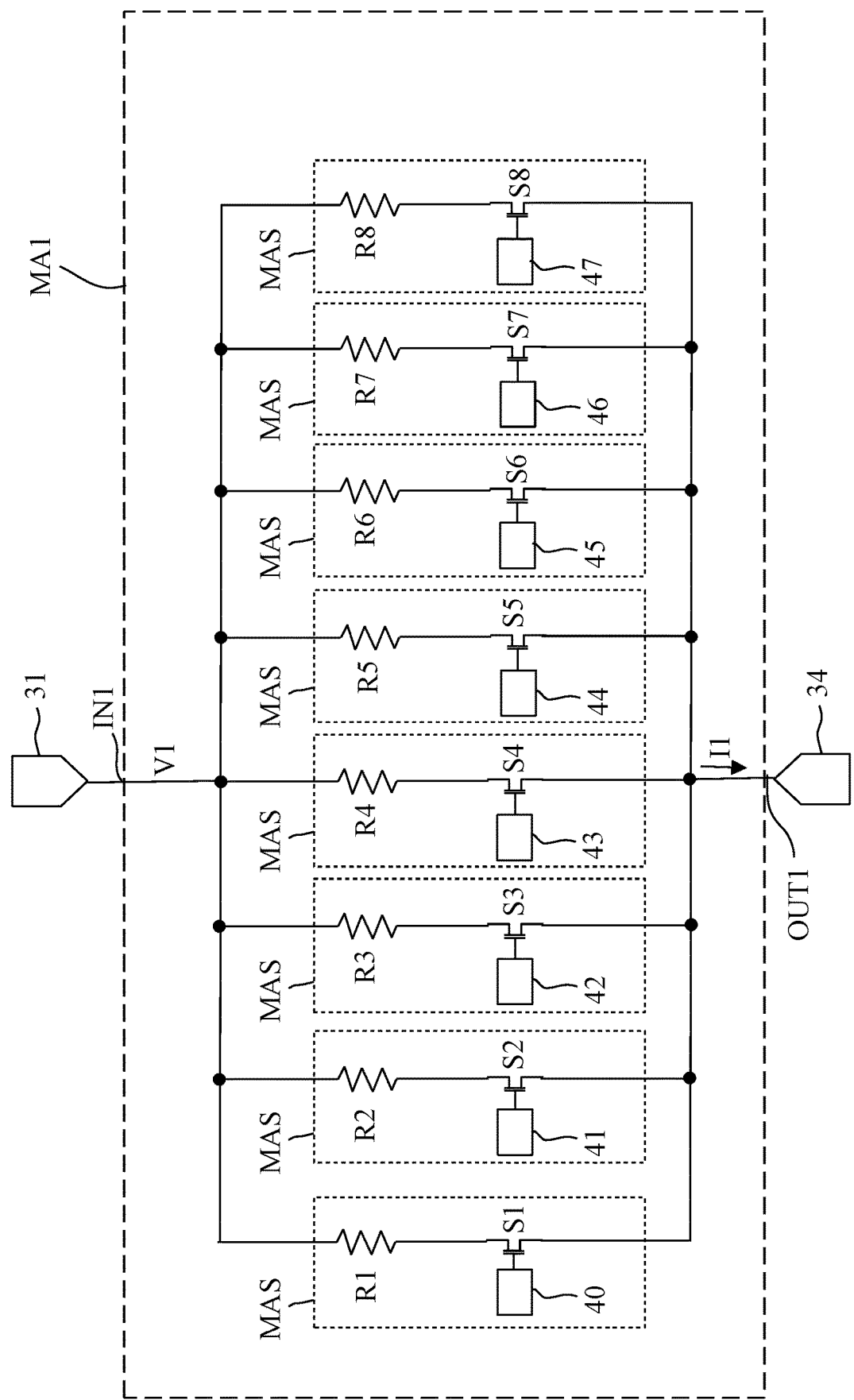
FIG. 5 schematically shows a first embodiment of the pseudo-analog memory computing unit MA1 of the present invention in FIG. 4.

The architectures of the pseudo-analog memory computing units MA1-MC3 are identical. Therefore, only the pseudo-analog memory computing unit MA1 is sufficient to exemplify all the pseudo-analog memory computing units MA1-MC3. FIG. 5 schematically shows a first embodiment of the pseudo-analog memory computing unit MA1. The pseudo-analog memory computing unit MA1 is connected between the input circuit 31 and the output circuit 34, having a plurality of weight modes to provide a plurality of weights. The pseudo-analog memory computing unit MA1 has an input terminal IN1 coupled to the input circuit 31 and an output terminal OUT1 coupled to the output circuit 34. The pseudo-analog memory computing unit MA1 performs computation and generates a computation result I1 to the coupled output circuit 34 according to the weight of the selected weight mode and an input signal V1 received by the input terminal IN1. The pseudo-analog memory computing unit MA1 includes a plurality of pseudo-analog memory computing subunits MAS. Each of the pseudo-analog memory computing subunits MAS includes a specified equivalent resistor R1, R2, R3, R4, R5, R6, R7 or R8; a switch S1, S2, S3, S4, S5, S6, S7 or S8; and a control circuit 40, 41, 42, 43, 44, 45, 46 or 47. The resistances of the specified equivalent resistors R1-R8 may be different, e.g. respectively r, 2r, 4r, 8r, 16r, 32r, 64r and 128r. Each of the specified equivalent resistors R1, R2, R3, R4, R5, R6, R7 and R8 may be formed by at least one resistor or at least one transistor operating in a linear region. Each of the switches S1-S8 is coupled to a corresponding one of the specified equivalent resistors R1-R8 in series; the switches S1-S8 and the specified equivalent resistors R1-R8 are disposed between the input circuit 31 and the output circuit 34. In the embodiment of FIG. 5, each of the switches S1-S8 is connected between the output terminal OUT1 and a corresponding one of the specified equivalent resistors R1-R8. In another embodiment, each of the switches S1-S8 may be connected between the input terminal IN1 and a corresponding one of the specified equivalent resistors R1-R8. Each of the control circuits 40-47 is coupled to a corresponding one of the switches S1-S8. Each of the control circuits 40-47 controls the on/off of a corresponding one of the switches S1-S8 according to the selected weight mode so as to determine the weight of the pseudo-analog memory computing unit MA1. The number of the pseudo-analog memory computing subunits MAS is not limited to the number shown in FIG. 5 but may be increased or decreased according to requirement. The more the pseudo-analog memory computing subunits MAS, the higher the similarity of the pseudo-analog memory computing unit MA1 to an analog circuit. Thereby, the pseudo-analog memory computing unit MA1 can provide an analog-featuring weight.

Figure 6:
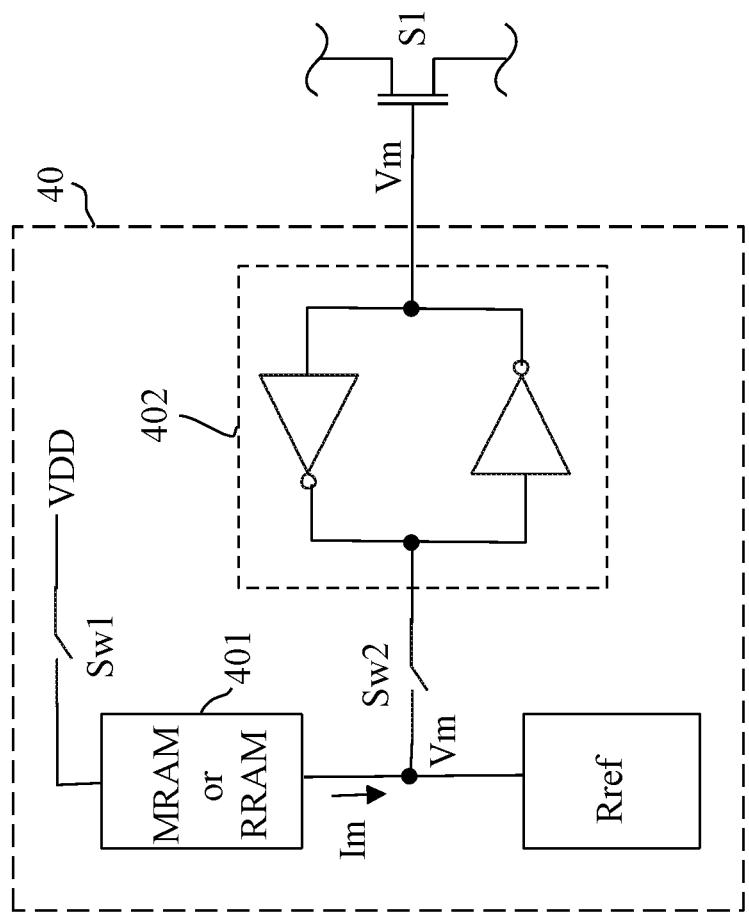
FIG. 6 schematically shows a first embodiment of the control circuit of the present invention in FIG. 5.

FIG. 6 schematically shows a first embodiment of the control circuit 40 in FIG. 5. The control circuit 40 includes a switch Sw1, a switch Sw2, a magnetoresistive random access memory (MRAM) or resistive random access memory (RRAM) 401, a reference resistor Rref, and a latch circuit 402. MRAM or RRAM 401 and the switch Sw1 are connected in series and between a power source VDD and the reference resistor Rref. The switch Sw2 is connected between the reference resistor Rref and the latch circuit 402. While the pseudo-analog memory computing circuit 30 enters a first weight mode, the switches Sw1 and Sw2 are turned on, whereby the power source VDD is supplied to MRAM or RRAM 401 for starting MRAM or RRAM 401. MRAM or RRAM 401 stores the data for determining the weight of the first weight mode and generates a current Im corresponding to the weight to the reference resistor Rref, whereby to generate a control signal Vm. The latch circuit 402 stores the control signal Vm and provides the control signal Vm to a switch S1 for turning on or off the switch S1. After the latch circuit 402 stores the control signal Vm, the switches Sw1 and Sw2 turn off to shut down MRAM or RRAM 401. Thus, the power consumption is decreased.

Figure 7:
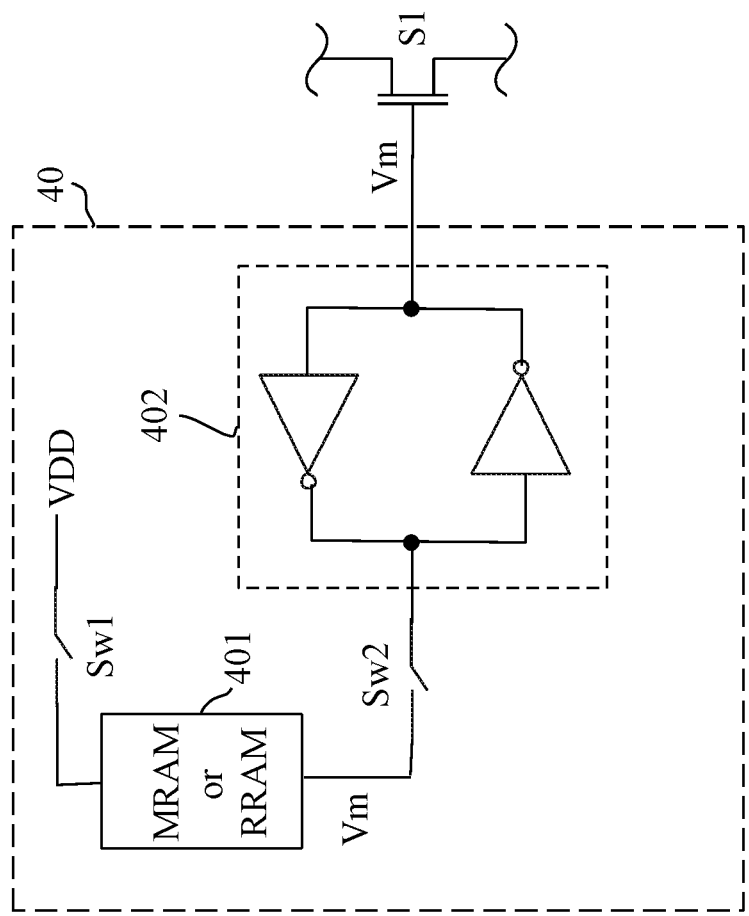
FIG. 7 schematically shows a second embodiment of the control circuit of the present invention in FIG. 5.

FIG. 7 schematically shows a second embodiment of the control circuit 40 in FIG. 5. The control circuit 40 in FIG. 7 is similar to the control circuit in FIG. 6 but is different in that the reference resistor Rref is omitted in the FIG. 7. While the pseudo-analog memory computing circuit 30 enters the first weight mode of the plurality of weight modes, the switches Sw1 and Sw2 are turned on, whereby the power source VDD is supplied to MRAM or RRAM 401 for starting MRAM or RRAM 401. MRAM or RRAM 401 stores the data for determining the weight of the first weight mode and generates a control signal Vm corresponding to the weight. The latch circuit 402 stores the control signal Vm and provides the control signal Vm to a switch S1 for turning on or off the switch S1. After the latch circuit 402 stores the control signal Vm, the switches Sw1 and Sw2 turn off to shut down MRAM or RRAM 401. Thus, the power consumption is decreased.

In the embodiments shown in FIG. 5, FIG. 6 and FIG. 7, the present invention adopts the pseudo-analog memory computing unit MA1, which is formed by the control circuit having MRAM or RRAM 401, the switches and the resistors, to provide an analog-featuring weight. In comparison with the conventional NOR flash memory that is hard to realize the multi-level cells, the pseudo-analog memory computing unit of the present invention can realize multi-bit operation. MRAM or RRAM 401 can be used in advanced processes and has higher operation speed and lower operation voltage. In the embodiments of FIG. 6 and FIG. 7, SRAM is unnecessary. Therefore, the data of MRAM or RRAM 401 needn't be loaded into SRAM. Thus, the computing circuit of the present invention occupies smaller area and reduces operation time.

Figure 9:
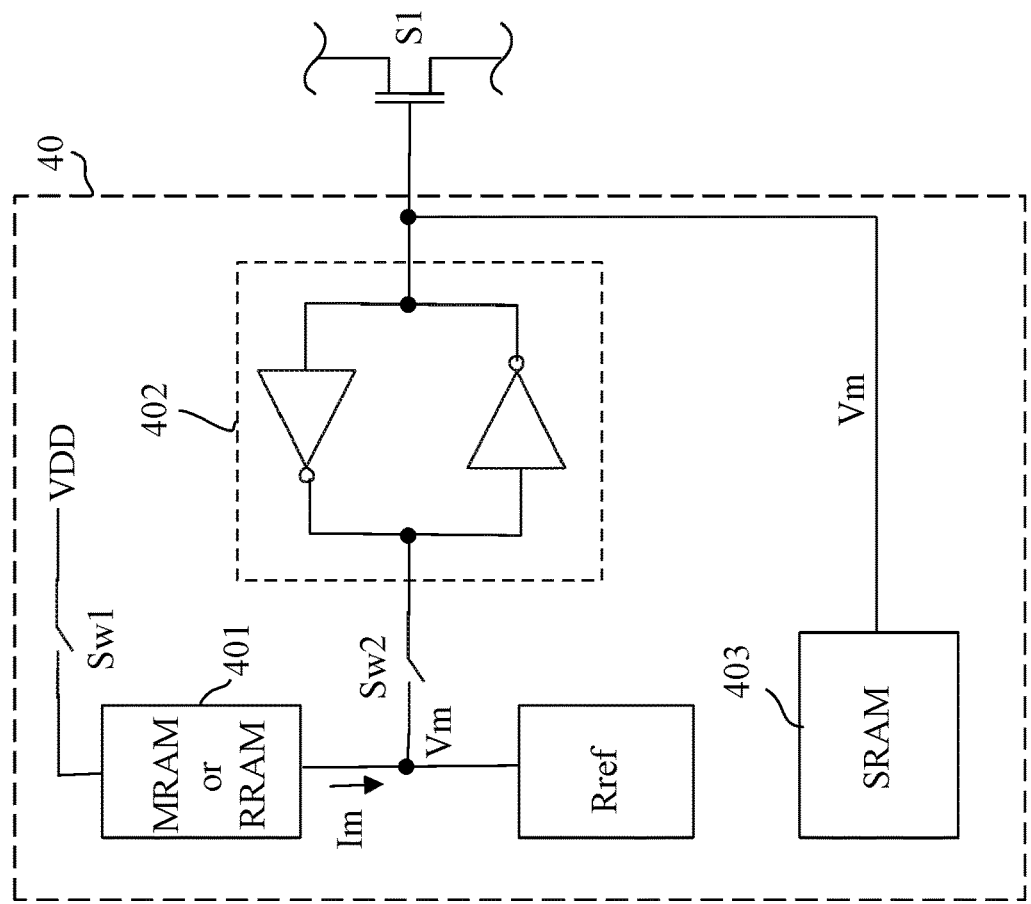
FIG. 9 schematically shows a fourth embodiment of the control circuit of the present invention in FIG. 5.
Figure 8:
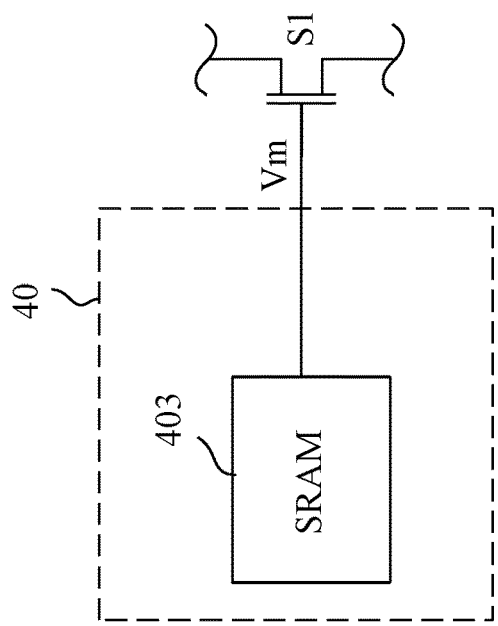
FIG. 8 schematically shows a third embodiment of the control circuit of the present invention in FIG. 5.

FIG. 8 schematically shows a third embodiment of the control circuit 40 in FIG. 5. In the third embodiment, a SRAM 403 stores data for determining the weights of different weight modes and provides different control signals Vm to control the switch S1 according to different weights. FIG. 9 schematically shows a fourth embodiment of the control circuit 40 in FIG. 5. In the fourth embodiment, the circuits in FIG. 6 and FIG. 8 are integrated together, and the user can select the operation mode of FIG. 6 or FIG. 8 according to requirement.

In FIGS. 6-9, the memory 401 or 403 may be a phase-change memory, a ferroelectric random access memory, a carbon nanotube memory, a float gate memory, a charge-trapping memory, a DRAM or a ferroelectric field-effect transistor.

The architectures of the control circuits 41-47 in FIG. 5 are the same as the architecture of the control circuit 40 and will not repeat herein.

Figure 10:
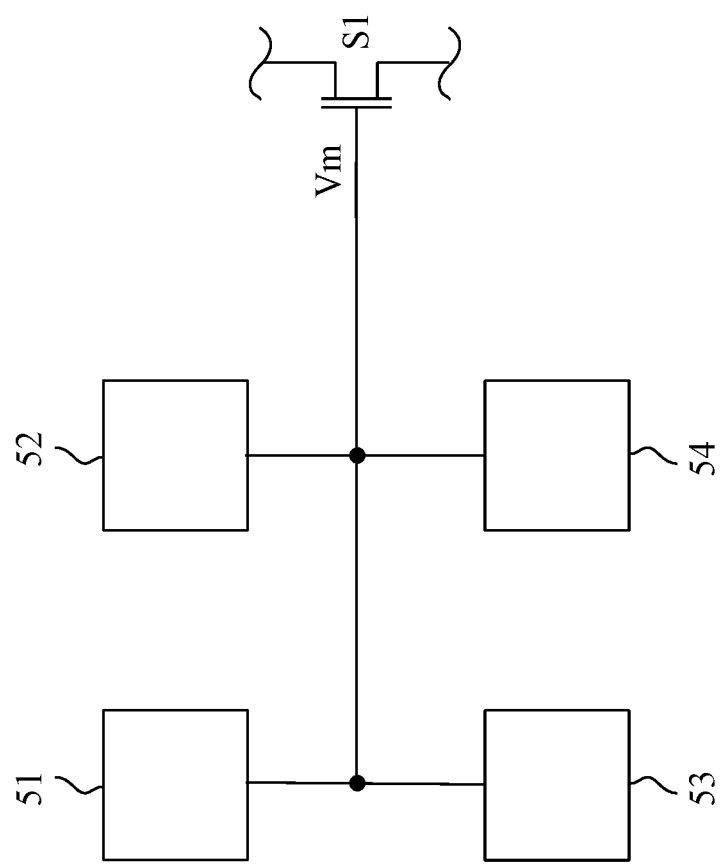
FIG. 10 schematically shows a second embodiment of the pseudo-analog memory computing unit MA1 of the present invention in FIG. 4.

In FIG. 5, each of the switches S1-S8 is only coupled to one of the control circuits 40-47. However, each of the switches S1-S8 may be coupled to two or more control circuits. FIG. 10 schematically shows a second embodiment of the pseudo-analog memory computing unit MA1. For convenience of description, FIG. 10 only shows the switch S1 and a plurality of control circuits 51-54 coupled to the switch S1. Please refer to FIG. 5 for the other portion of the pseudo-analog memory computing unit MA1. In FIG. 10, the plurality of control circuits 51-54 is respectively corresponding to a plurality of weight modes. For example, in the first weight mode, the control circuit 51 is enabled to control the switch S1; in the second weight mode, the control circuit 52 is enabled to control the switch S1; in the third weight mode, the control circuit 53 is enabled to control the switch S1; in the fourth weight mode, the control circuit 54 is enabled to control the switch S1. Please refer to FIGS. 6-9 for the details of the control circuits 51-54.

Figure 11:
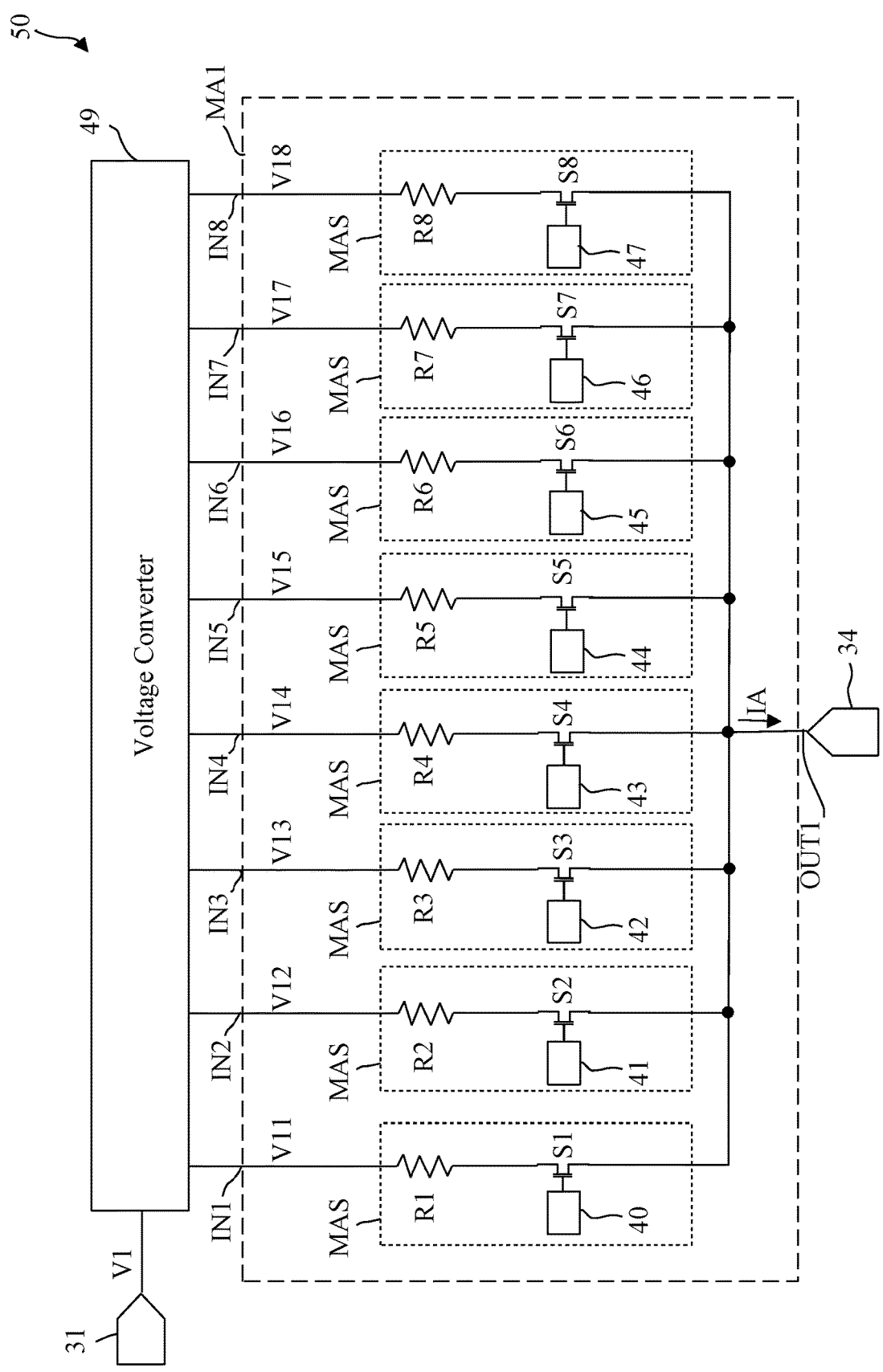
FIG. 11 schematically shows a second embodiment of the pseudo-analog memory computing circuit of the present invention.

FIG. 11 schematically shows a second embodiment of the pseudo-analog memory computing circuit of the present invention. In FIG. 11, the pseudo-analog memory computing circuit 50 of the present invention comprises an input circuit 31, an output circuit 34, a voltage converter 49, and a pseudo-analog memory computing unit MA1. The voltage converter 49 is connected between the input circuit 31 and the pseudo-analog memory computing unit MA1. The pseudo-analog memory computing unit MA1 is connected between the voltage converter 49 and the output circuit 34, having a plurality of weight modes for providing a plurality of weights. The pseudo-analog memory computing unit MA1 includes a plurality of input terminals IN1, IN2, IN3, IN4, IN5, IN6, IN7 and IN8, which are coupled to the voltage converter 49. The pseudo-analog memory computing unit MA1 also has an output terminal OUT1 which is coupled to the output circuit 34. Similarly to the pseudo-analog memory computing unit MA1 in FIG. 5, the pseudo-analog memory computing unit MA1 in FIG. 11 also includes a plurality of pseudo-analog memory computing subunit MAS. The plurality of pseudo-analog memory computing subunit MAS is respectively coupled to the plurality of input terminals IN1, IN2, IN3, IN4, IN5, IN6, IN7 and IN8. The voltage converter 49 converts the voltage V1 from the input circuit 31 into a plurality of voltages V11, V12, V13, V14, V15, V16, V17 and V18. The voltages V11, V12, V13, V14, V15, V16, V17 and V18 are respectively provided to the plurality of pseudo-analog memory computing subunit MAS. The resistances of the resistors R1-R8 of the plurality of pseudo-analog memory computing subunit MAS may be equal or different. The control circuits 40-47 respectively control the on or off of the switches S1-S8 according to the weight modes selected currently, whereby to determine the weight of the pseudo-analog memory computing unit MA1 and generate the computation result IA. Please refer to FIGS. 6-9 for the details of the control circuits 40-47 in FIG. 11.

The pseudo-analog memory computing circuit 50 of FIG. 11 only shows one input circuit 31, one output circuit 34 and one pseudo-analog memory computing unit MA1. However, the pseudo-analog memory computing circuit 50 of the present invention may alternatively comprise a plurality of input circuits 31, 32 and 33, a plurality of output circuits 34, 35 and 36 and a plurality of pseudo-analog memory computing units MA1-MC3, as shown in FIG. 4. Each pseudo-analog memory computing unit may have its own voltage converter 49. Alternatively, the plurality of pseudo-analog memory computing units may share a common voltage converter 49. For example, the pseudo-analog memory computing units MA1, MB1 and MC1, which are coupled to the input circuit 31, share a first voltage converter 49; the pseudo-analog memory computing units MA2, MB2 and MC2, which are coupled to the input circuit 32, share a second voltage converter 49; the pseudo-analog memory computing units MA3, MB3 and MC3, which are coupled to the input circuit 33, share a third voltage converter 49.

Figure 12:
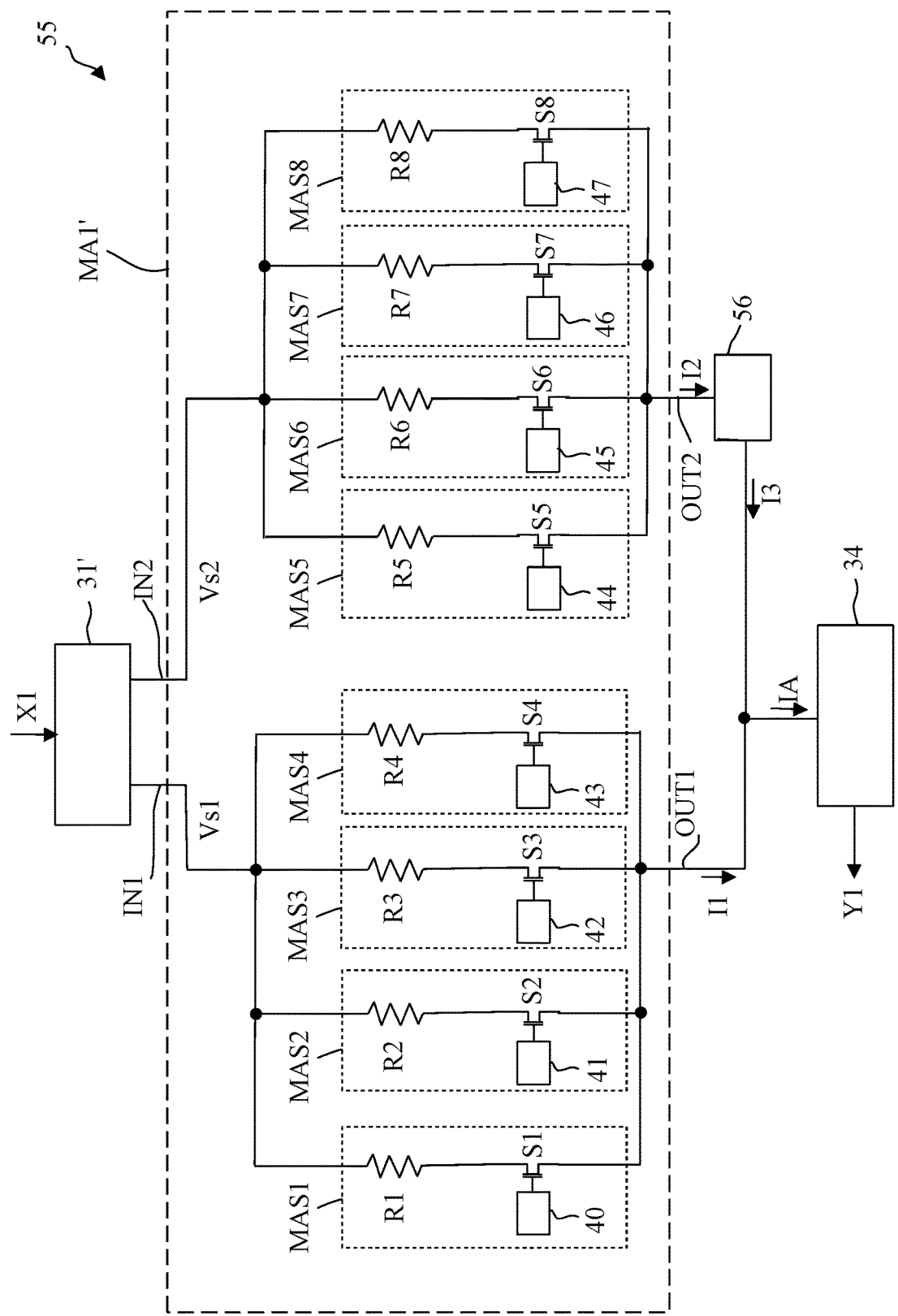
FIG. 12 schematically shows a third embodiment of the pseudo-analog memory computing circuit of the present invention.

FIG. 12 schematically shows a third embodiment of the pseudo-analog memory computing circuit of the present invention. For convenience of description, the pseudo-analog memory computing circuit 55 of FIG. 12 only shows one input circuit 31', one pseudo-analog memory computing unit MA1', one conversion circuit 56, and one output circuit 34. The pseudo-analog memory computing circuit 55 may alternatively comprise a plurality of input circuits, a plurality of pseudo-analog memory computing units, and a plurality of output circuits, as shown in FIG. 4. In such a case, the pseudo-analog memory computing circuit 55 further comprises a plurality of conversion circuits 56, which are respectively coupled to the plurality of pseudo-analog memory computing units. The input circuit 31' in FIG. 12 may be a digital-to-analog converter. The input circuit 31' converts the high byte data of the input data Da into an input signal Vs1 and converts the low byte data of the input data Da into an input signal Vs2. The pseudo-analog memory computing unit MA1' has two input terminals IN1 and IN2 and two output terminals OUT1 and OUT2. The pseudo-analog memory computing unit MA1' includes a plurality of pseudo-analog memory computing subunits MAS1-MAS8. The pseudo-analog memory computing subunits MAS1-MAS4 are connected between the input terminal IN1 and the output terminal OUT1. The pseudo-analog memory computing subunits MAS5-MAS8 are connected between the input terminal IN2 and the output terminal OUT2. Each of the pseudo-analog memory computing subunits MAST-MAS8 includes a specified equivalent resistor R1, R2, R3, R4, R5, R6, R7 or R8; a switch S1, S2, S3, S4, S5, S6, S7 or S8; and a control circuit 40, 41, 42, 43, 44, 45, 46 or 47.

The control circuits 40-47 respectively control the switches S1-S8 according to the weight modes so as to determine the on or off of the pseudo-analog memory computing subunits MAS1-MAS8. The pseudo-analog memory computing subunits MAS1-MAS4 generate a computation result I1 according to the input signal Vs1. The pseudo-analog memory computing subunits MAS5-MAS8 generate a computation result I2 according to the input signal Vs2. The conversion circuit 56 generates a computation result I3 according to the computation result I2. There are many circuits able to realize the conversion circuit 56. For example, the conversion circuit 56 may be a divider which divides the computation result I2 by a preset value to generate the computation result I3. The computation results I1 and I3 accumulate to generate a computation result IA to the output circuit 34. Please refer to FIGS. 6-9 for the details of the control circuits 40-47 in FIG. 12.

Figure 13:
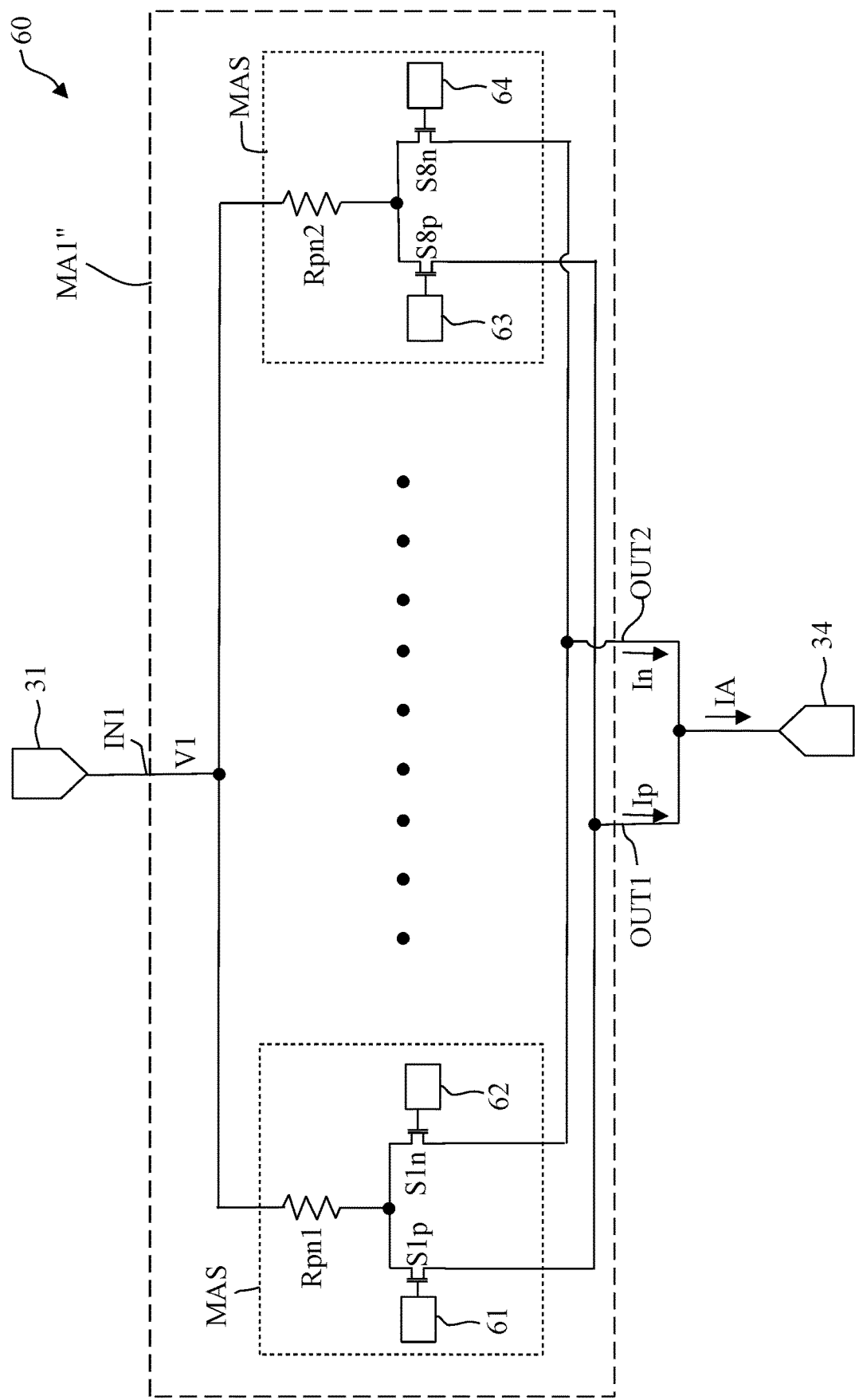
FIG. 13 schematically shows a fourth embodiment of the pseudo-analog memory computing circuit of the present invention.

FIG. 13 schematically shows a fourth embodiment of the pseudo-analog memory computing circuit of the present invention. In FIG. 13, the pseudo-analog memory computing circuit 60 of the present invention comprises an input circuit 31, a pseudo-analog memory computing unit MA1", and an output circuit 34. The pseudo-analog memory computing unit MA1" has an input terminal IN1 coupled to the input circuit 31 and two output terminals OUT1 and OUT2 coupled to the output circuit 34. The input circuit 31 provides an input signal V1 to the input terminal IN1. The output terminals OUT1 and OUT2 of the pseudo-analog memory computing unit MA1" provide the computation results Ip and In to the output circuit 34. The pseudo-analog memory computing unit MA1" includes a plurality of pseudo-analog memory computing subunits MAS. Each pseudo-analog memory computing subunit MAS includes a specified equivalent resistor Rpn1 or Rpn2; two switches S1p and S1n or two switches S8p and S8n; and two control circuits 61 and 62 or two control circuits 63 and 64. The plurality of pseudo-analog memory computing subunits MAS operates in the same principle. Herein, only the first one of the plurality of pseudo-analog memory computing subunits MAS is used for explanation. The specified equivalent resistor Rpn1 is coupled to the input terminal IN1 of the pseudo-analog memory computing unit MA1". The switch S1p is connected between the specified equivalent resistor Rpn1 and the output terminal OUT1 of the pseudo-analog memory computing unit MA1". The switch S1n is connected between the specified equivalent resistor Rpn1 and the output terminal OUT2 of the pseudo-analog memory computing unit MA1". In the embodiment of FIG. 13, the control circuits 61 and 62 of the pseudo-analog memory computing subunit MAS turn on the switch S1p or S1n according to the polarity of the input signal V1 and the polarity of the weight. For example, while both the input signal V1 and the weight have a positive polarity "1" or a negative polarity "0" simultaneously, the control circuit 61 turns on the switch S1p, and the control circuit 62 turns off the switch S1n, whereby a computation result Ip is sent to the output circuit 34; while both the input signal V1 and the weight respectively have different polarities (one has a positive polarity "1", and the other one has a negative polarity "0"), the control circuit 61 turns off the switch S1p, and the control circuit 62 turns on the switch S1n, whereby a computation result In is sent to the output circuit 34. In one embodiment, an XOR gate (not shown in the drawings) is used to determine whether the polarity of the input signal V1 and the polarity of the weight are the same. The XOR gate may be arranged in the control circuits 61 and 62.

Figure 14:
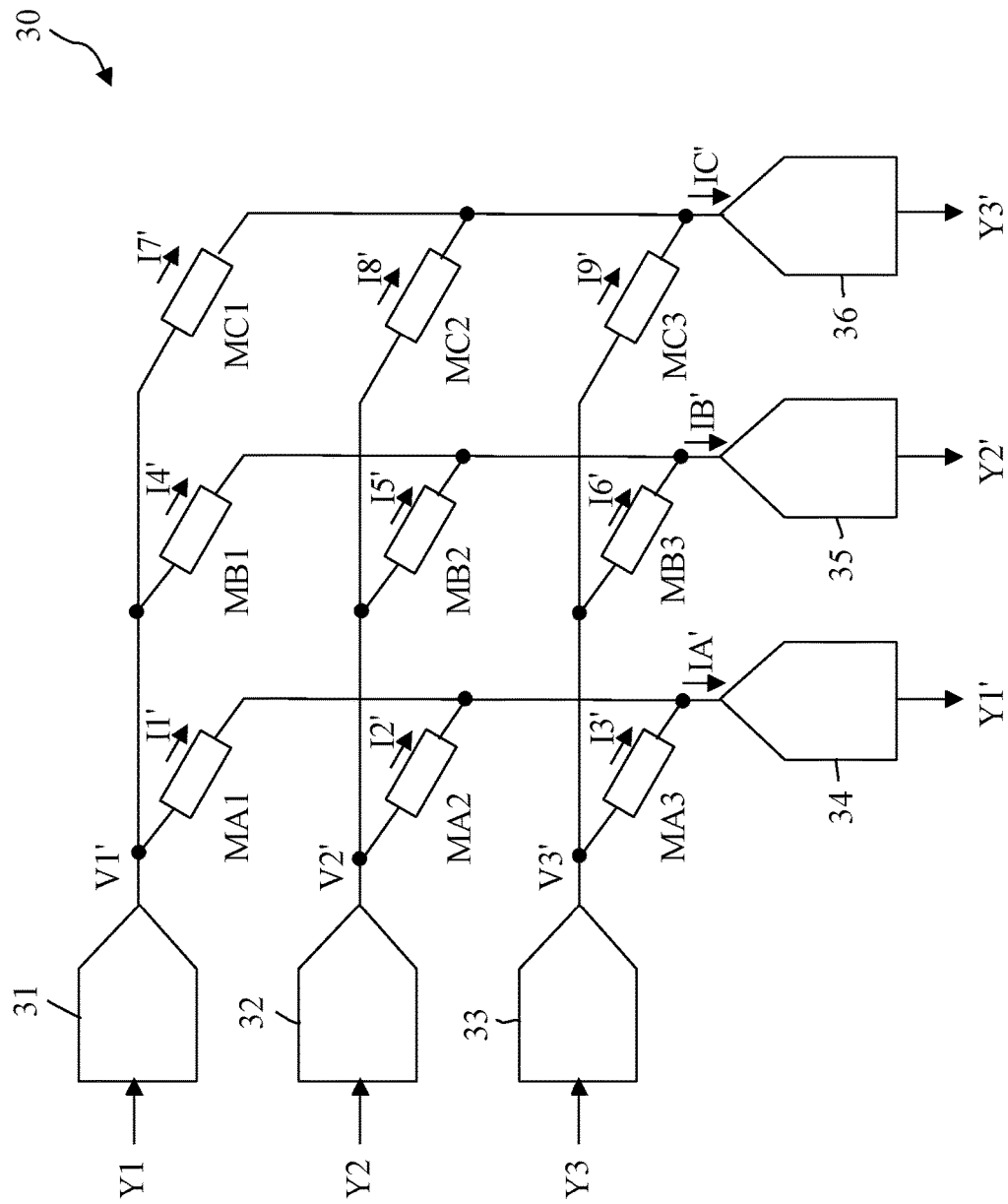
FIG. 14 schematically shows a first embodiment of the multi-layer computation of the pseudo-analog memory computing circuit of the present invention.

FIG. 14 schematically shows a first embodiment of the multi-layer computation of the pseudo-analog memory computing circuit of the present invention. Refer to FIG. 4 again. While the pseudo-analog memory computing circuit 30 is in a first weight mode, the pseudo-analog memory computing units MA1, MA2 and MA3 respectively generate computation results I1, I2 and I3 according to the weight of the first weight mode and the input signals V1, V2 and V3 which are provided by the input circuits 31, 32 and 33. The computation results I1, I2 and I3 accumulate to form the computation result IA. The output circuit 34 generates the output data Y1 according to the computation result IA. Similarly, the pseudo-analog memory computing units MB1, MB2 and MB3 respectively generate computation results I4, I5 and I6 according to the weight of the first weight mode and the input signals V1, V2 and V3. The computation results I4, I5 and I6 accumulate to form the computation result IB. The output circuit 35 generates the output data Y2 according to the computation result IB. The pseudo-analog memory computing units MC1, MC2 and MC3 respectively generate computation results I7, I8 and I9 according to the weight of the first weight mode and the input signals V1, V2 and V3. The computation results I7, I8 and I9 accumulate to form the computation result IC. The output circuit 36 generates the output data Y3 according to the computation result IC. Refer to FIG. 14. After the first weight mode ends, the pseudo-analog memory computing units MA1-MC3 enter a second weight mode. Then, the output data Y1, Y2 and Y3, which are acquired in the first mode, are respectively provided to the input circuits 31, 32 and 33, whereby to generate second input signals V1', V2' and V3'. In other embodiments, the first output data Y1, Y2 and Y3 are converted into conversion data beforehand, and then the conversion data are provided to the input circuits 31, 32 and 33. For example, the first output data Y1, Y2 and Y3 are multiplied or divided by a preset value, and then the resultant data are provided to the input circuits 31, 32 and 33. Next, the pseudo-analog memory computing units MA1-MC3 generate computation results IA', IB' and IC' according to the weight of the second weight mode and the second input signals V1', V2' and V3'. The output circuits 34, 35 and 36 generate second output data Y1', Y2' and Y3' according to the computation results IA', IB' and IC'. It is not necessary for the present invention to use additional pseudo-analog memory computing circuits to perform multi-layer computation. Therefore, the present invention occupies smaller area than the conventional technology.

Figure 15:
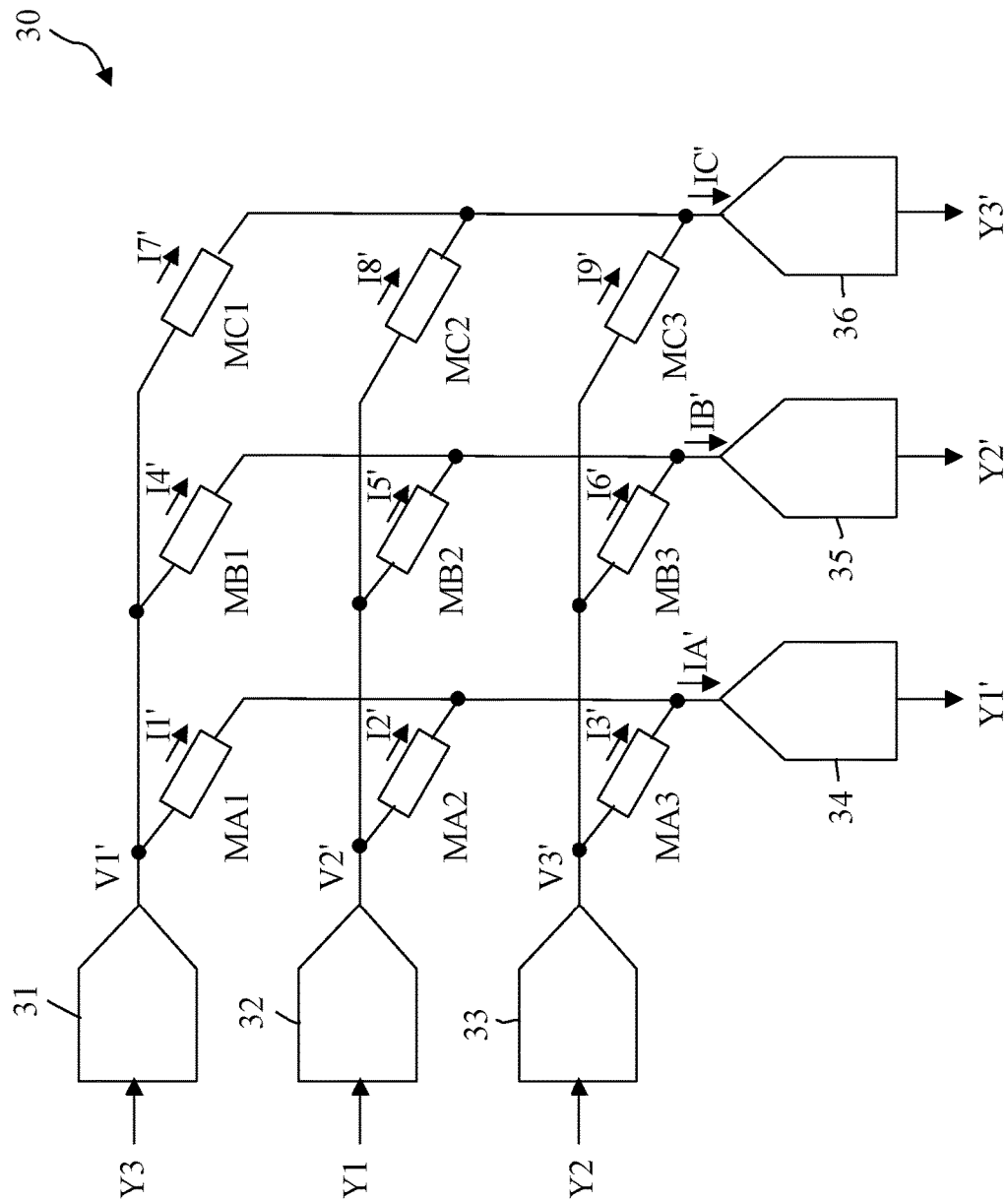
FIG. 15 schematically shows a second embodiment of the multi-layer computation of the pseudo-analog memory computing circuit of the present invention.

In FIG. 14, the output data Y1 outputted by the first output circuit 34 is fed back to the first input circuit 31, the output data Y2 outputted by the second output circuit 35 is fed back to the second input circuit 32, and the output data Y3 outputted by the third output circuit 36 is fed back to the third input circuit 33. However, the present invention is not limited by the embodiment shown in FIG. 14. FIG. 15 schematically shows a second embodiment of the multi-layer computation of the pseudo-analog memory computing circuit of the present invention. In the embodiment of FIG. 15, the output data Y1 outputted by the first output circuit 34 is fed back to the second input circuit 32, the output data Y2 outputted by the second output circuit 35 is fed back to the third input circuit 33, and the output data Y3 outputted by the third output circuit 36 is fed back to the first input circuit 31.

The embodiments have been described above to demonstrate the principles of the present invention and enable the persons skilled in the art to understand, make, and use the present invention. However, these embodiments are only to exemplify the present invention but not to limit the scope of the present invention. The technical thought and scope of the present invention is defined by the claims stated below and the equivalents thereof. Any modification or variation according to the principle, spirit or embodiment of the present invention is to be also included by the scope of the present invention.

What is claimed is:

1. A pseudo-analog memory computing circuit, comprising:
   at least one input circuit, configured to receive at least one input data, wherein each input circuit generates at least one input signal according to one of said at least one input data;
   at least one output circuit, configured to provide at least one output data; and
   at least one pseudo-analog memory computing unit, wherein each pseudo-analog memory computing unit includes at least one input terminal coupled to one of said at least one input circuit, at least one output terminal coupled to one of said at least one output circuit, and a plurality of weight modes;
   wherein said each pseudo-analog memory computing unit is configured to generate at least one first computation result at said at least one output terminal according to a weight of a selected weight mode and said at least one input signal received by said at least one input terminal, and send said at least one first computation result to a coupled output circuit which is coupled to said at least one output terminal.

2. A pseudo-analog memory computing circuit, comprising:
   at least one input circuit, configured to receive at least one input data, wherein each input circuit generates at least one input signal according to one of said at least one input data;
   at least one output circuit, configured to provide at least one output data; and
   at least one pseudo-analog memory computing unit, wherein each pseudo-analog memory computing unit includes at least one input terminal coupled to one of said at least one input circuit, at least one output terminal coupled to one of said at least one output circuit, and at least one weight mode;
   wherein said each pseudo-analog memory computing unit is configured to generate at least one first computation result at said at least one output terminal according to a weight of a selected weight mode and said at least one input signal received by said at least one input terminal, and send said at least one first computation result to a coupled output circuit which is coupled to said at least one output terminal;
   wherein said each pseudo-analog memory computing unit includes at least one pseudo-analog memory computing subunit, and each pseudo-analog memory computing subunit includes:
   at least one specified equivalent resistor;
   at least one switch, connected between said at least one input terminal and said at least one specified equivalent resistor, or connected between said at least one specified equivalent resistor and said at least one output terminal; and
   at least one control circuit, coupled to said at least one switch, configured to control turning on or off of said at least one switch according to said selected weight mode so as to determine turning on or off of said each pseudo-analog memory computing subunit.

3. The pseudo-analog memory computing circuit according to claim 1, wherein said each input circuit includes a metal wire, and said at least one input signal is equal to an input data received by said each input circuit.

4. The pseudo-analog memory computing circuit according to claim 2, wherein said at least one specified equivalent resistor is formed by at least one resistor.

5. The pseudo-analog memory computing circuit according to claim 2, wherein said at least one specified equivalent resistor is formed by at least one transistor operating in a linear region.

6. The pseudo-analog memory computing circuit according to claim 2, wherein said at least one control circuit includes at least one memory, and data stored in said at least one memory determines weight of said at least one weight mode.

7. The pseudo-analog memory computing circuit according to claim 6, wherein said at least one memory includes a magnetoresistive random access memory, a resistive random access memory, a phase-change memory, a ferroelectric random access memory, a carbon nanotube memory, a float gate memory, a charge-trapping memory, a dynamic random access memory, a static random access memory or a ferroelectric field-effect transistor.

8. A pseudo-analog memory computing circuit, comprising:
   at least one input circuit, configured to receive at least one input data, wherein each input circuit generates at least one input signal according to one of said at least one input data;
   at least one output circuit, configured to provide at least one output data;
   at least one pseudo-analog memory computing unit, wherein each pseudo-analog memory computing unit includes at least one input terminal coupled to one of said at least one input circuit, at least one output terminal coupled to one of said at least one output circuit, and at least one weight mode, wherein said each pseudo-analog memory computing unit is configured to generate at least one first computation result at said at least one output terminal according to a weight of a selected weight mode and said at least one input signal received by said at least one input terminal, and send said at least one first computation result to a coupled output circuit which is coupled to said at least one output terminal; and
   a conversion circuit coupled to one of said at least one output terminal and said coupled output circuit, wherein said conversion circuit converts one of said at least one first computation result into a second computation result to said coupled output circuit.

9. A pseudo-analog memory computing circuit, comprising:
   at least one input circuit, configured to receive at least one input data, wherein each input circuit generates at least one input signal according to one of said at least one input data;
   at least one output circuit, configured to provide at least one output data; and
   at least one pseudo-analog memory computing unit, wherein each pseudo-analog memory computing unit includes at least one input terminal coupled to one of said at least one input circuit, at least one output terminal coupled to one of said at least one output circuit, and at least one weight mode;
   wherein said each pseudo-analog memory computing unit is configured to generate at least one first computation result at said at least one output terminal according to a weight of a selected weight mode and said at least one input signal received by said at least one input terminal, and send said at least one first computation result to a coupled output circuit which is coupled to said at least one output terminal;

wherein while a first weight mode of said at least one weight mode ends, said pseudo-analog memory computing circuit determines said at least one input data according to said at least one output data and enters a second weight mode of said at least one weight mode.

* * * * *